(12) United States Patent
Chen

(10) Patent No.: US 7,408,781 B1
(45) Date of Patent: Aug. 5, 2008

(54) COOLING DEVICE FOR MEMORY CHIPS

(75) Inventor: Wei-Hau Chen, Taipei (TW)

(73) Assignee: CompTake Technology Inc., Taipei County (TW)

( * ) Notice: Subject to any disclaimer, the term of this patent is extended or adjusted under 35 U.S.C. 154(b) by 0 days.

(21) Appl. No.: 11/822,039

(22) Filed: Jul. 2, 2007

(30) Foreign Application Priority Data

Jun. 1, 2007 (TW) .............................. 96209081 U

(51) Int. Cl.
  *H05K 7/20* (2006.01)
  *F28D 15/00* (2006.01)
(52) U.S. Cl. ...................... 361/715; 361/704; 361/709; 361/719; 165/104.33; 165/185
(58) Field of Classification Search ................ 361/704, 361/709–710, 715–716, 719, 728; 165/104.33, 165/185; 174/16.3
See application file for complete search history.

(56) References Cited

U.S. PATENT DOCUMENTS

| | | | | |
|---|---|---|---|---|
| 7,221,569 | B2* | 5/2007 | Tsai | 361/704 |
| 7,312,996 | B2* | 12/2007 | Chang | 361/704 |
| 2007/0151705 | A1* | 7/2007 | Kwan | 165/80.2 |

* cited by examiner

*Primary Examiner*—Jayprakash N Gandhi
*Assistant Examiner*—Robert J Hoffberg

(57) ABSTRACT

A cooling device includes two side boards and a memory device is clamped between the two side boards. A cooling unit is positioned above the two side boards by two clips and includes a plurality of fins. A heat conduction member is connected with the cooling unit and inserted into a slot defined in one of the two side boards so as to directly in contact with the memory chips of the memory device. The heat is directly conducted to the heat conduction member and can be dispensed by the fins of the cooling unit.

5 Claims, 4 Drawing Sheets

COOLING DEVICE FOR MEMORY CHIPS

BACKGROUND OF THE INVENTION (1) Field of the Invention

The present invention relates to a cooling device for removing heat from the memory chips.

(2) Description of the Prior Art

Memory chips generate heat due to high speed of operation and the heat has to be removed to keep stable operation of the memory chips. A conventional cooling device for removing heat from the memory chips generally includes two cooling plates and the chips are clamped between the two cooling plates, the heat from the chips are conducted to the cooling plates which have large area so as to dispense heat from the memory chips. However, the latest computer systems are operated at an even higher speed and the heat generated is higher than the old systems so that an efficient cooling device is needed to remove the heat.

The present invention intends to provide a cooling device for removing heat from the memory chips, and includes a cooling unit connected to the cooling plates on two sides of the memory device. The cooling unit includes a heat conduction member which is directly in contact with the memory chips of the memory device such that the heat can be efficiently removed via the cooling plates and the cooling unit.

SUMMARY OF THE INVENTION

The present invention relates to a cooling device which comprises two side boards and a memory device is clamped between the two side boards. One of the side boards includes a slot in which a heat conduction member is inserted so as to be directly in contact with the memory chip. A cooling unit includes a plurality of fins and is located above the side boards by two clips. The heat conduction member is connected with the cooling unit.

The primary object of the present invention is to provide a cooling device which includes two side boards for clamping the memory device and a cooling unit is connected to a top of the side boards by clips. A heat conduction member connected with the cooling unit is directly contact with the memory chips of the memory device so as to efficiently transfer heat away from the memory chips via the cooling unit.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENTS

Figure 1:
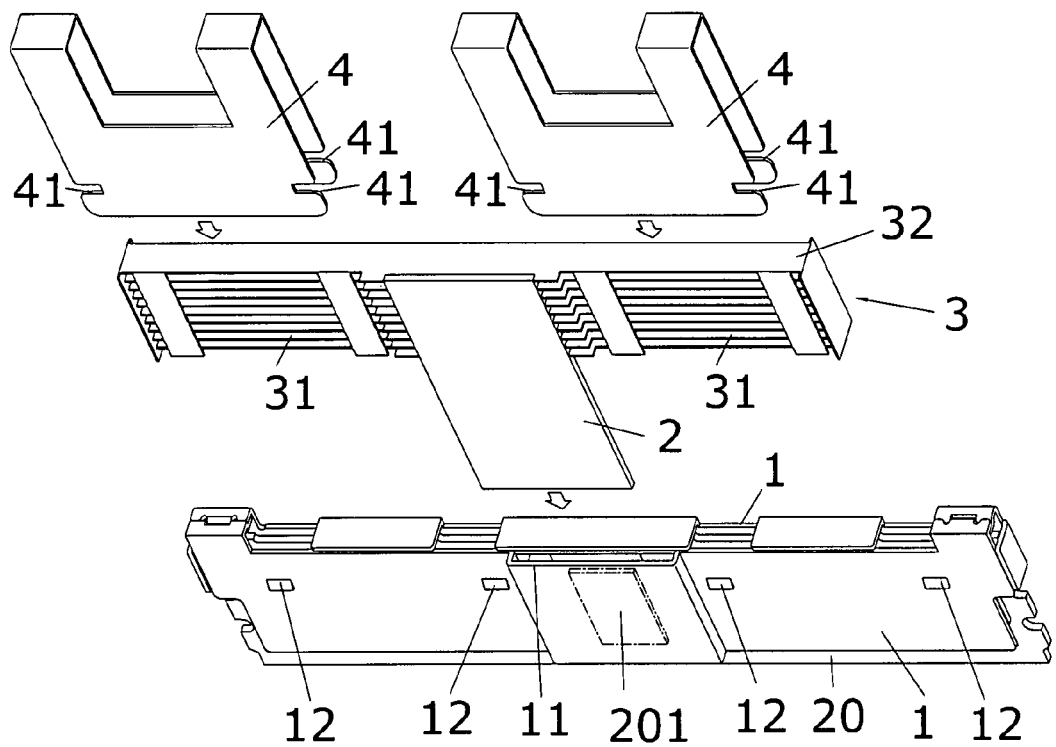
FIG. 1 is an exploded view to show the cooling device of the present invention.
Figure 2:
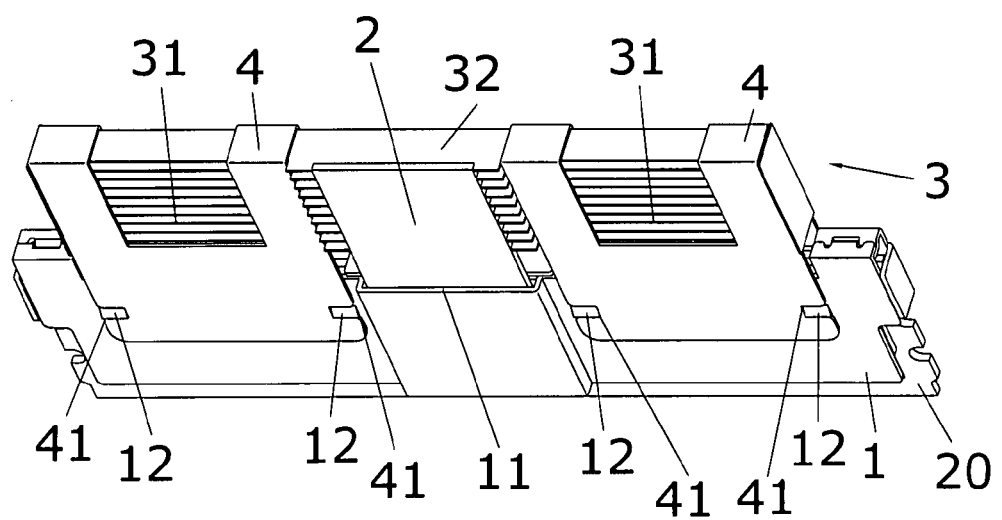
FIG. 2 is a perspective view to show the cooling device of the present invention.

Referring to FIGS. 1 and 2, the cooling device of the present invention comprises two side boards 1 and a memory device 20 is clamped between the two side boards 1. One of the side boards 1 includes a slot 11 and each of the two side boards 1 has protrusions 12 extending from an outside thereof.

A heat conduction member 2 is inserted into the slot 11 and directly in contact with the memory chips 201. The heat conduction member 2 is a thin plate and is connected with a cooling unit 3 which includes a frame 32 and a plurality of fins 31 are positioned by the frame 32. The cooling unit 3 is located above the side boards 1 and two clips 4 clamp the cooling unit 3 to the side boards 1 from a top of the cooling unit 3. Each of the two clips 4 includes a plurality of notches 41 and the protrusions 12 on the side boards 1 are engaged with the notches 41.

The heat from the memory chips 201 are directly conducted to the heat conduction member 2 and dispensed by the fins 31 of the cooling unit 3.

Figure 3:
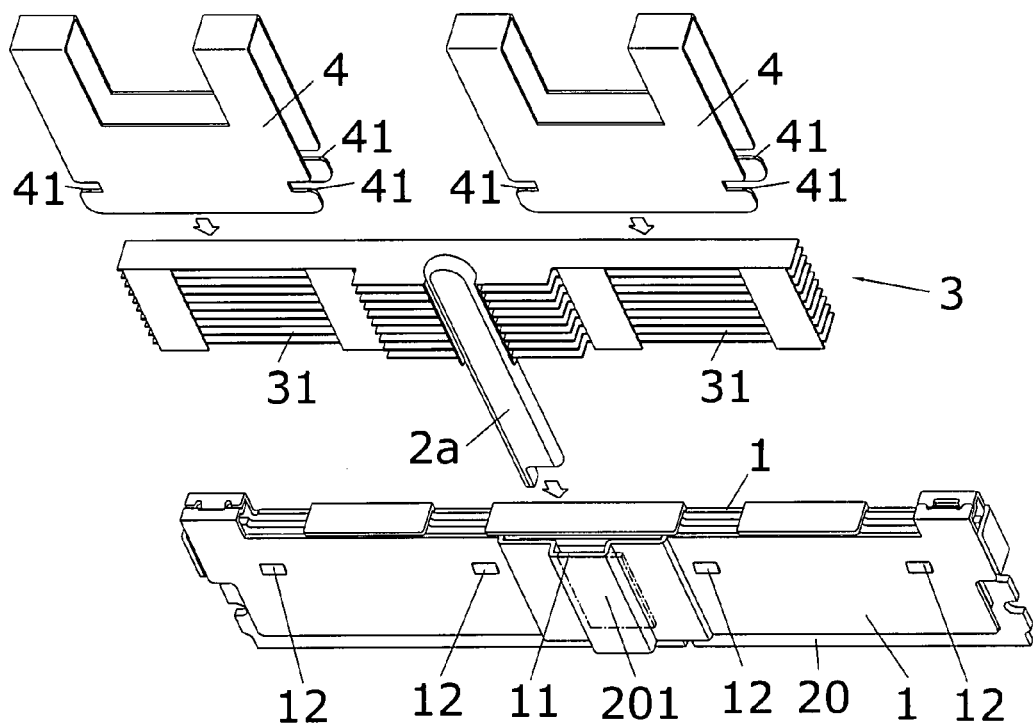
FIG. 3 is an exploded view to show another embodiment of the cooling device of the present invention.
Figure 4:
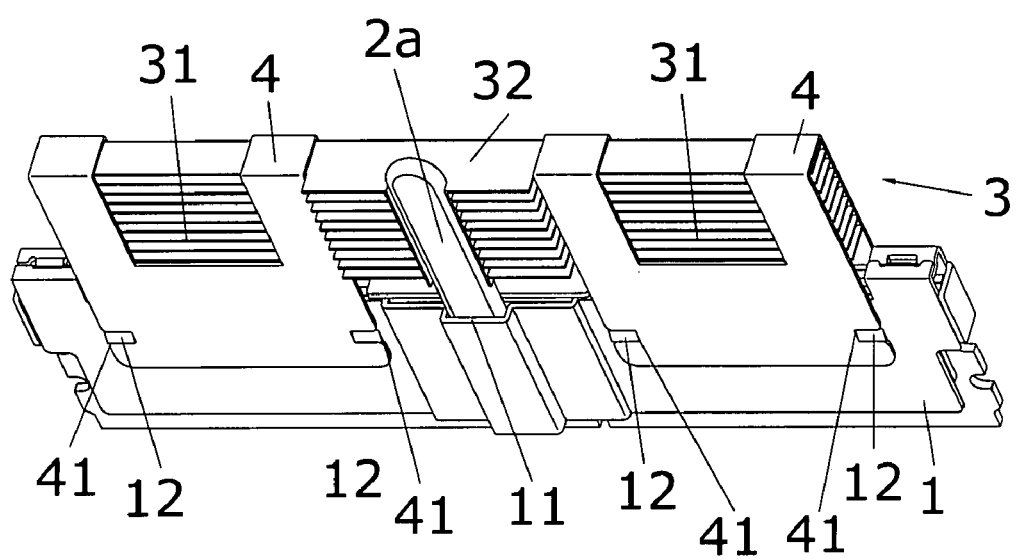
FIG. 4 is a perspective view to show the cooling device of the present invention in FIG. 3.

FIGS. 3 and 4 show another embodiment of the cooling device of the present invention, wherein the only difference from the first embodiment is that the heat conduction member 2a is a tube which is inserted into the slot 11 and the memory chips 201 are directly in contact with an inside of the heat conduction member 2a.

While we have shown and described the embodiment in accordance with the present invention, it should be clear to those skilled in the art that further embodiments may be made without departing from the scope of the present invention.

What is claimed is:

1. A cooling device comprising:

two side boards and a memory device clamped between the two side boards, one of the side boards includes a slot;

a heat conduction member inserted into the slot and directly in contact with memory chips;

a cooling unit including a plurality of fins and located above the side boards, the heat conduction member connected with the cooling unit, and two clips clamping the cooling unit to the side boards.

2. The cooling device as claimed in claim 1, wherein the cooling unit includes a frame so as to position the fins.

3. The cooling device as claimed in claim 1, wherein the heat conduction member is thin plate.

4. The cooling device as claimed in claim 1, wherein the heat conduction member is a tube.

5. The cooling device as claimed in claim 1, wherein each of the two clips includes a plurality of notches and the side boards have protrusions which are engaged with the notches.

* * * * *